United States Patent
Ueno et al.

(10) Patent No.: US 7,611,951 B2
(45) Date of Patent: Nov. 3, 2009

(54) METHOD OF FABRICATING MOS TRANSISTOR HAVING EPITAXIAL REGION

(75) Inventors: Tetsuji Ueno, Suwon-si (KR); Hwa-Sung Rhee, Seongnam-si (KR); Ho Lee, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 482 days.

(21) Appl. No.: 11/517,246

(22) Filed: Sep. 8, 2006

(65) Prior Publication Data
US 2007/0054457 A1 Mar. 8, 2007

(30) Foreign Application Priority Data
Sep. 8, 2005 (KR) .................. 10-2005-0083578

(51) Int. Cl.
*H01L 21/336* (2006.01)
(52) U.S. Cl. .............. 438/300; 438/199; 438/305; 257/E21.461; 257/E21.459
(58) Field of Classification Search .......... 438/199, 438/299–302, 305–306; 257/E21.459, E21.461
See application file for complete search history.

(56) References Cited
U.S. PATENT DOCUMENTS
6,852,600 B1 2/2005 Wang et al.

2008/0029815 A1 * 2/2008 Chen et al. .............. 257/347

FOREIGN PATENT DOCUMENTS
KR 10-2002-0013197 2/2002
KR 10-2004-0009752 1/2004

* cited by examiner

*Primary Examiner*—Thanhha Pham
(74) *Attorney, Agent, or Firm*—Harness, Dickey & Pierce

(57) ABSTRACT

Example embodiments relate to a method of manufacturing a semiconductor device. Other example embodiments relate to a method of manufacturing a metal-oxide-semiconductor (MOS) transistor having an epitaxial region disposed in a lower portion of sidewalls of a gate pattern. Provided is a method of manufacturing a MOS transistor having an epitaxial region which improves an epitaxial growth rate and which may have fewer defects. The method of manufacturing a MOS transistor having an epitaxial region may include forming a gate pattern on a semiconductor substrate, forming a first ion implantation region having a first damage profile by implanting first impurity ions into the semiconductor substrate using the gate pattern as an ion implantation mask, forming a second ion implantation region having a second damage profile adjacent to the first damage profile by implanting second impurity ions into the semiconductor substrate using the gate pattern as an ion implantation mask and partially etching a lower portion of sidewalls of the gate pattern and forming in-situ an epitaxial region on the etched semiconductor substrate.

23 Claims, 4 Drawing Sheets

METHOD OF FABRICATING MOS TRANSISTOR HAVING EPITAXIAL REGION

PRIORITY STATEMENT

This application claims priority under 35 U.S.C. § 119 to Korean Patent Application No. 10-2005-0083578, filed on Sep. 8, 2005, in the Korean Intellectual Property Office (KIPO), the entire contents of which are incorporated herein by reference.

BACKGROUND

1. Field

Example embodiments relate to a method of manufacturing a semiconductor device. Other example embodiments relate to a method of manufacturing a metal-oxide-semiconductor (MOS) transistor having an epitaxial region disposed in a lower portion of sidewalls of a gate pattern.

2. Description of the Related Art

A metal-oxide-semiconductor (MOS) transistor may include a gate pattern formed on a semiconductor substrate and source/drain regions formed in a portion of the semiconductor substrate near lower portions of both sidewalls of the gate pattern. The gate pattern may include a gate insulation layer formed on the semiconductor substrate, a gate electrode layer formed on the gate insulation layer and a gate hard mask layer formed on the gate electrode layer. A gate spacer layer may be formed on the sidewalls of the gate pattern. In a MOS transistor, when a threshold voltage is applied to a gate electrode thereof, a channel layer may be formed near a surface of a semiconductor substrate which may be a lower portion of a gate pattern. When a drain voltage is applied, current may flow between a source region and a drain region, according to the carrier movement and the MOS transistor may operate.

In the conventional art, a silicon substrate in a lower portion of both sidewalls of the gate pattern may be selectively etched using an etching solution and an epitaxial layer, including germanium (Ge), may be formed in the etched portion, thereby inducing a compressive stress in the channel region. According to the conventional art, because the silicon substrate of the lower portions of the sidewalls of the gate pattern may be etched in a wet or dry etching apparatus, and then an epitaxial growth process for the etched portion may be performed in a chemical vapor deposition (CVD) apparatus, an intermediate treatment process (e.g., a washing process) for the etched portion may be performed before the epitaxial growth process, resulting in increased processing time.

SUMMARY

Example embodiments relate to a method of manufacturing a semiconductor device. Other example embodiments relate to a method of manufacturing a metal-oxide-semiconductor (MOS) transistor having an epitaxial region disposed in a lower portion of sidewalls of a gate pattern.

Example embodiments provide a method of manufacturing a MOS transistor that reduces processing time due to the omission of an intermediate treatment process (e.g., a washing process), increases an epitaxial growth rate and forms an epitaxial region having fewer defects.

According to example embodiments, there is provided a method of manufacturing a MOS transistor that includes forming a gate pattern on a semiconductor substrate, forming a first ion implantation region having a first damage profile by implanting first impurity ions into the semiconductor substrate using the gate pattern as an ion implantation mask, forming a second ion implantation region having a second damage profile adjacent to the first damage profile by implanting second impurity ions into the semiconductor substrate using the gate pattern as an ion implantation mask and partially etching a lower portion of sidewalls of the gate pattern and forming in-situ an epitaxial region on the etched semiconductor substrate.

In the forming of the second ion implantation region, a pre-amorphization implantation (PAI) process for amorphizing a portion of the semiconductor substrate may be performed. The forming of the second ion implantation region may be for reducing, if not preventing, channeling of the second impurity ions. The amorphous portion of the semiconductor substrate may remain partially in the lower portion of the sidewalls of the gate pattern.

The first damage profile may be substantially equal to the second damage profile. The difference between the peak of the first damage profile and the peak of the second damage profile may be less than about 10%. When the MOS transistor is a PMOS transistor, the first impurity ions may be Ge and the second impurity ions may be one of B, $BF_2$, As, and Sb. The first impurity ions may be Ge, the second impurity ions may be $BF_2$, the ion implantation energy of the germanium (Ge) may be in a range of about 3 KeV to about 5 KeV and the ion implantation energy of the $BF_2$ may be in a range of about 3 KeV to about 4 KeV. A depth of the first ion implantation region may be greater than that of the second ion implantation region.

The partial etching of the lower portion of sidewalls of the gate pattern on the etched semiconductor substrate and the forming of the epitaxial region may be performed in the same chemical vapor deposition (CVD) reaction chamber. In the partial etching of the lower portion of sidewalls of the gate pattern on the etched semiconductor substrate, the semiconductor substrate may be isotropically etched. In the partial etching of the lower portion of sidewalls of the gate pattern on the etched semiconductor substrate, the amorphous portion of the semiconductor substrate may remain at least partially in the lower portion of the sidewalls of the gate pattern. An HCl gas may be used as an etching gas in the partial etching of the semiconductor substrate, and the partial etching may be performed in a temperature range of about 650° C. to about 800° C. $GeH_4$, $SiH_4$, and/or $SiH_2Cl_2$ (Dichlorosilane, DCS) may be mixed with the HCl gas in order to accelerate the etching process. The epitaxial region may be formed of silicon germanium (SiGe) or a material having a SiGe structure. The forming of the epitaxial region may be performed in a temperature range of about 650° C. to about 800° C. using a source gas comprising silicon germanium (SiGe). When the MOS transistor is a NMOS transistor 16, the epitaxial region may be formed of silicon carbon (SiC) or a material having a SiC structure.

The method may further include forming a first gate spacer on the sidewalls of the gate pattern after the formation of the gate pattern and before the formation of the first ion implantation region. The method may further include forming a halo ion implantation region by implanting halo dopants into the semiconductor substrate using the gate pattern as an ion implantation mask before or after the formation of the first ion implantation region and the formation of the second ion implantation region. The method may further include forming a second gate spacer on the sidewalls of the gate pattern after the formation of the second ion implantation region. The method may further include forming the second ion implantation region for source/drain regions before the partial etching of the lower portion of sidewalls of the gate pattern on the etched semiconductor substrate. A lattice constant of the epitaxial region may be different from that of the semiconductor substrate. A compressive stress for a PMOS transistor or a tensile stress for a NMOS transistor may be induced in the semiconductor substrate between the epitaxial region. The method may further include an annealing process at lower than about 900° C. before the formation of the epitaxial region.

In example embodiments, because the partial etching process and the epitaxial region formation process may be performed in-situ, an additional washing process may not be necessary and an epitaxial growth may be performed even in a lower portion of the sidewalls of a gate where the epitaxial growth is usually incomplete (e.g., an undercut portion of a lower portion of a gate spacer layer).

BRIEF DESCRIPTION OF THE DRAWINGS

Example embodiments will be more clearly understood from the following detailed description taken in conjunction with the accompanying drawings.

FIGS. 1-4 are diagrams illustrating a process of manufacturing a MOS transistor having an epitaxial region according to example embodiments;

FIG. 5 is a graph of damage profiles after performing a pre-amorphization implantation (PAI) process according to example embodiments;

FIG. 6 is a photograph of a MOS transistor when the ion implantation energy of germanium (Ge) second impurity ions used in the PAI process of FIG. 5 may be about 10 KeV according to example embodiments;

FIG. 7 is a photograph of a MOS transistor when the ion implantation energy of the germanium (Ge) second impurity ions used in the PAI process of FIG. 5 may be about 5 KeV according to example embodiments;

FIG. 8 is a graph illustrating relationships between a turn-on current and a turn-off current of the transistor of FIG. 6 according to example embodiments; and FIG. 9 is a graph illustrating relationships between a turn-on current and a turn-off current of the transistor of FIG. 7 according to example embodiments.

DETAILED DESCRIPTION OF EXAMPLE EMBODIMENTS

Figure 1:
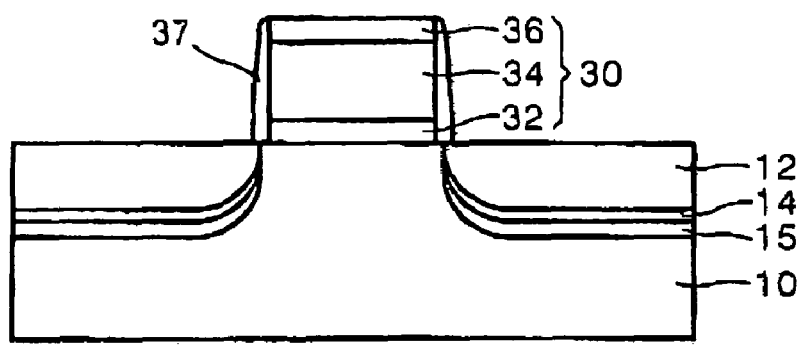
FIGS. 1-9 represent non-limiting, example embodiments as described herein.

Hereinafter, example embodiments will be described more fully with reference to the accompanying drawings, in which example embodiments are shown. Example embodiments may, however, be embodied in many different forms and should not be construed as being limited to example embodiments set forth herein; rather, these example embodiments are provided so that this disclosure will be thorough and complete, and will fully convey the concept of example embodiments to those skilled in the art. In the drawings, like reference numerals denote like elements, and the sizes and thicknesses of layers and regions are exaggerated for clarity.

It will be understood that, although the terms first, second, etc. may be used herein to describe various elements, these elements should not be limited by these terms. It will be understood that, although the terms first, second, etc. may be used herein to describe various elements, these elements should not be limited by these terms.

The terminology used herein is for the purpose of describing particular embodiments only and is not intended to be limiting of example embodiments. As used herein, the singular forms "a", "an" and "the" are intended to include the plural forms as well, unless the context clearly indicates otherwise.

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

In example embodiments, a PMOS transistor including germanium (Ge) as an epitaxial region which may provide a compressive stress to a silicon channel region will be described in detail. Because an NMOS transistor may be manufactured by simply substituting germanium (Ge) with carbon (C) which may apply a tensile stress to a channel region, a detailed description thereof will be omitted.

Example embodiments relate to a method of manufacturing a semiconductor device. Other example embodiments relate to a method of manufacturing a metal-oxide-semiconductor (MOS) transistor having an epitaxial region disposed in a lower portion of sidewalls of a gate pattern.

FIGS. 1-4 are diagrams illustrating a process of manufacturing a PMOS transistor having an epitaxial region according to example embodiments.

Referring to FIG. 1, a gate insulation layer 32, a gate electrode layer 34 and a gate hard mask layer 36 may be sequentially stacked on a semiconductor substrate 10 and partially etched using a conventional photographic etching process, thereby forming a gate pattern 30 having the gate insulation layer 32, the gate electrode layer 34, and the gate hard mask layer 36. An element isolation region (not illustrated), defining an active region where a semiconductor device, may be formed in a given portion of the semiconductor substrate 10 using a trench method or a local oxidation of silicon (LOCOS) method before forming the gate insulation layer 32.

A single crystal silicon substrate may be used for the semiconductor substrate 10, but, if necessary, a silicon germanium (SiGe) substrate may be used for the semiconductor substrate 10. A proper concentration of n-type dopants (e.g., phosphorus or arsenic ions) may be implanted into the semiconductor substrate 10 of the PMOS transistor. The gate insulation layer 32 may be formed of various insulation materials (e.g., silicon oxide, silicon oxide nitride, metal oxide, and/or metal oxide nitride). The gate electrode layer 34 may be formed of impurity doped polysilicon, metal (e.g., tungsten, copper, and/or aluminum) and/or a conductive metal layer (e.g. a nitride metal layer and/or any other suitable conductive metal layer). The gate hard mask layer 36 may be formed of, for example, silicon nitride and/or the like. A gate spacer material (e.g., a silicon oxide and/or silicon nitride) may be formed on the entire surface of the semiconductor substrate 10 having the gate pattern 30 using an etching process, thereby forming first gate spacer layers 37 on both sides of the gate pattern 30.

Second impurity ions may be implanted into the entire surface of the semiconductor substrate 10 using the first gate spacer layer 37 and the gate pattern 30 as ion implantation masks, thereby forming a second ion implantation region 14. First impurity ions may be implanted, thereby forming a first ion implantation region 12. The implantation of the first impurity ions may be to amorphize a given region of the semiconductor substrate 10 and it may be known as a pre-amorphization ion implantation (PAI) process. The implantation of the second impurity ions may be to retard, if not prevent, the first impurity ions from channeling into the inside of the semiconductor substrate 10. In example embodiments, while the operation of implanting the first impurity ions may be performed after the operation of implanting the second impurity ions, the order of these operations may be reversed.

The first impurity ions may be selected from various impurity ions (e.g., B, $BF_2$, As, and/or Sb) which may amorphize the semiconductor substrate 10 in the ion implantation process. In example embodiments, the first impurity ions may be formed of $BF_2$. The ion implantation energy of $BF_2$ may be about 3 KeV to about 4 KeV. The second impurity ions may reduce the channeling of the first impurity ions and the second impurity ions may be formed of germanium (Ge) in example embodiments. The ion implantation energy of germanium (Ge) may be about 3 KeV to about 5 KeV and the implantation concentration of germanium (Ge) may be about $5 \times 1014/cm^2$ to about $2 \times 1015/cm^2$.

To reduce, if not prevent, the channeling of the impurity ions for amorphization, the implantation depth of the first impurity ions may be greater than that of the second impurity ions (see FIG. 1), but the implantation depths of both first and second impurity ions may be approximately equal, or the implantation depth of the second impurity ions may be greater than that of the first impurity ions.

Referring to FIG. 1, a halo ion implantation region 15 may be further formed. The halo ion implantation region 15 may be formed by implanting impurity ions (e.g., n-type impurity ions for the PMOS transistor) which may have the same conductivity as the semiconductor substrate 10 in example embodiments. The halo ion implantation region 15 may reduce, if not prevent, impurity ions in the source/drain regions, which will be formed in subsequent processes from diffusing into the semiconductor substrate 10, for example, the channel regions. The implantation depth for forming the halo ion implantation region 15 may be greater than the depth of the second ion implantation region 14 in FIG. 1, but it may be greater or less than the depth of the first or the second ion implantation region 12, or 14, if required.

In addition to the formation of the halo ion implantation region 15, low concentration impurity ions, which may have the same conductivity as the impurity ions in the source/drain regions, may be implanted such that a lightly doped drain (LDD) region may be formed on lower portions of the sidewalls of the gate pattern 30. The operation of forming the lightly doped drain region may be performed arbitrarily before or after the operations of forming the first ion implantation region 12, the second ion implantation region 14, and/or the halo ion implantation region 15. In FIG. 1, the operation of forming the first gate spacer layer 37, the operation of forming the first ion implantation region 12, the operation of forming the second ion implantation region 14, the operation of forming the halo ion implantation region 15 and the operation of forming the lightly doped drain region may be performed in this order, but this order may be arbitrarily selected, and all or some of these operations may be arbitrarily selected to be performed before the formation of the first gate spacer layer 37.

In example embodiments, the operations of forming the ion implantation regions are described, but example embodiments are not limited thereto. For example, a drive-in operation may be arbitrarily performed after performing each of the above-described ion implantation operations in order to obtain a desired profile through the diffusion of the impurity ions, if required.

Figure 2:
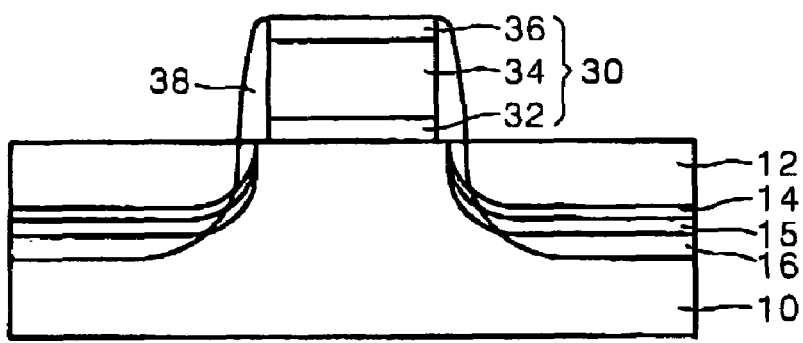

Referring to FIG. 2, a second gate spacer material (e.g., a silicon oxide and/or silicon nitride) may be formed on the entire surface of the semiconductor substrate 10 and an etching process may be performed, thereby forming second gate spacer layers 38 including the first gate spacer layers 37. The second gate spacer layer 38 may be a double spacer layer including the first gate spacer layer 37, but may be not limited thereto. The second gate spacer layer 38 may be formed after selectively removing the first gate spacer layer 37 and may be a homogeneous material layer or a heterogeneous material layer. An ion implantation of third impurity ions for forming source/drain regions may be performed using the second gate spacer layer 38 and the gate pattern 30 as ion implantation masks to form a third ion implantation region 16.

Figure 3:
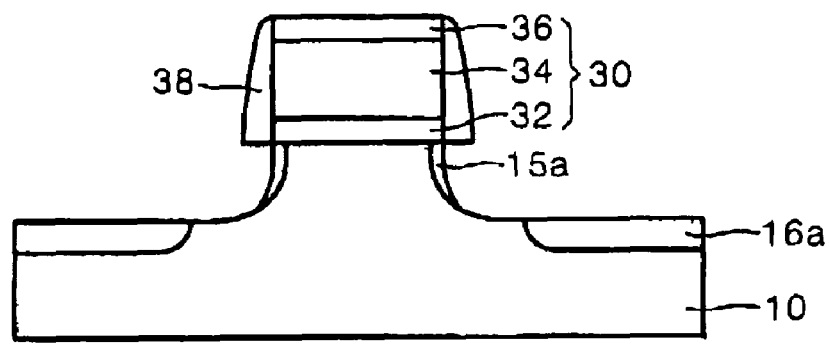

Referring to FIG. 3, the semiconductor substrate 10 may be loaded into a chemical vapor deposition (CVD) apparatus and a portion of the exposed surface of the semiconductor substrate 10 may be selectively and partially etched using the second gate spacer layer 38 and the gate pattern 30 as etching masks. The etching of the semiconductor substrate 10 may be performed using an HCl group gas in a temperature range of about 650° C. to about 800° C. Hydrogen gas (e.g., $GeH_4$, $SiH_4$, and/or $SiH_2Cl_2$ (Dichlorosilane, DCS)) may be mixed with the HCl gas such that the HCl gas acts as a catalyst for etching silicon using thermal equilibrium between gases.

The partial etching process may be performed to obtain an isotropic etching result. An under-cut portion may be formed in a lower portion of the second gate spacer layer 38. The etching depth may vary according to the device design. A portion (not illustrated) of a lightly doped drain region or a portion 15a of the halo ion implantation region 15 may remain in the portion contacting a channel region 19 (see FIG. 4), and the halo ion implantation region 15. For the under-cut portion in the lower portion of the second gate spacer layer 38, an amorphized portion due to the first impurity ions and the second impurity ions may remain in at least a portion of the exposed sidewalls and bottom of the semiconductor substrate 10 such that the subsequent epitaxial growth process may be performed. In FIG. 3, a portion 16a of the third ion implantation region 16 may remain after performing the partial etching, but example embodiments are not limited thereto. The partial etching may be performed to a proper depth regardless of the implantation depths of the first ion implantation region 12, the second ion implantation region 14, the halo ion implantation region 15 and/or the third ion implantation region 16, but a proper number of impurity ions may remain near the surface of the etched semiconductor substrate 10 in order to rapidly form the subsequent epitaxial region.

Figure 4:
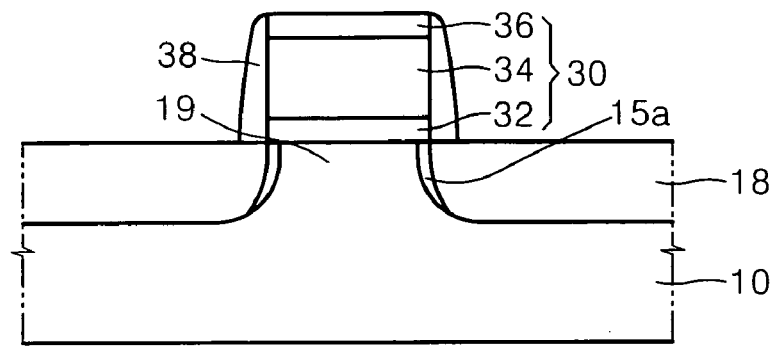

Referring to FIG. 4, an epitaxial region 18 may be formed in-situ on the partially etched surface of the semiconductor substrate 10 in the CVD apparatus. The epitaxial region 18 may be formed to maintain the crystal state of the exposed surface of the semiconductor substrate 10 and to have the same crystal orientation. The epitaxial region 18 may be formed of the same material used to form the channel region 19 in the lower portion of the gate pattern 30 or of a material having the same lattice constant as the material used to form the channel region 19. The epitaxial region 18 may be formed of a material having a different lattice constant from the material used to form the channel region 19 so as to induce a compressive stress or a tensile stress in the channel region 19. In example embodiments, a silicon germanium (SiGe) layer for the epitaxial region 18 may be formed using a gas, including germanium (Ge), as a source gas. For example, $SiH_2Cl_2$, HCl, and $GeH_4$ may be used as the source gas to form the epitaxial region 18. In FIG. 4, a top surface of the epitaxial region 18 may be level with a top surface of the semiconductor substrate 10, but the top surface of the epitaxial region 18 may be higher or lower than the top surface of the semiconductor substrate 10.

As illustrated in FIG. 2, the epitaxial region 18 may be formed after forming the third ion implantation region 16 for source/drain regions according to example embodiments. The epitaxial region 18 may be formed with the simultaneous implantation of p type impurity ions when the ion implantation process for the source/drain regions may or may not be performed. After the formation of the epitaxial region 18, the formation of a MOS transistor having epitaxial regions 18 in the lower portions of both sidewalls of the gate pattern 30 may be complete. To improve, if not optimize, the conditions for forming the epitaxial region 18, a correlation between the first ion implantation region 12 and the second ion implantation region 14 during the PAI process may be obtained, as illustrated in FIG. 5.

Figure 5:
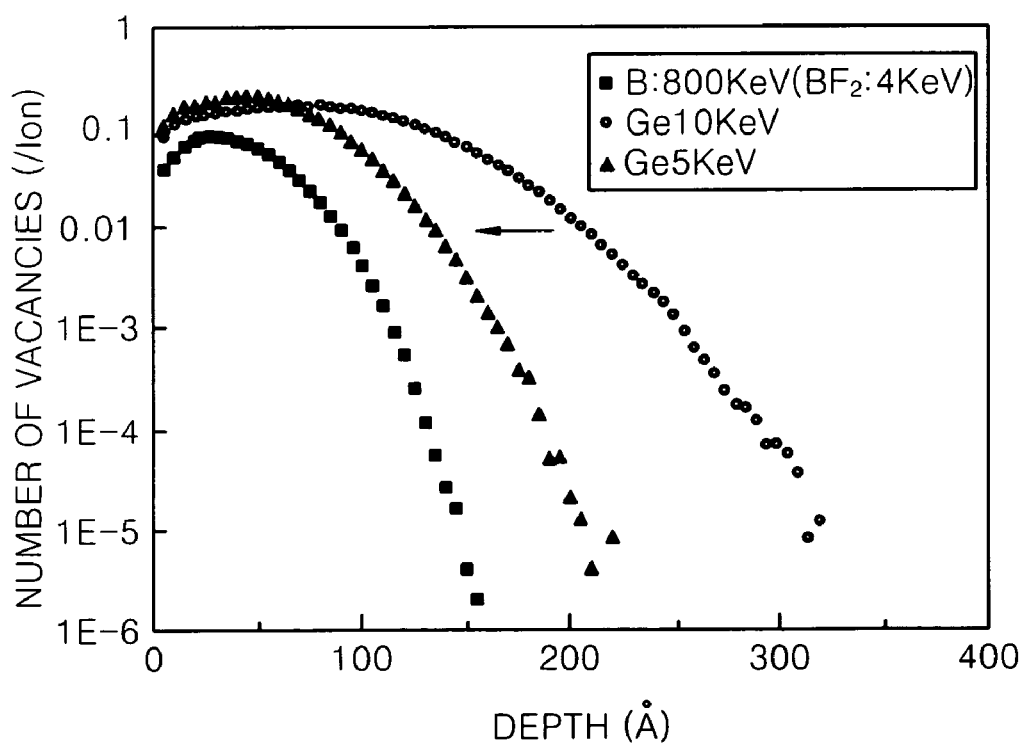
Figure 6:
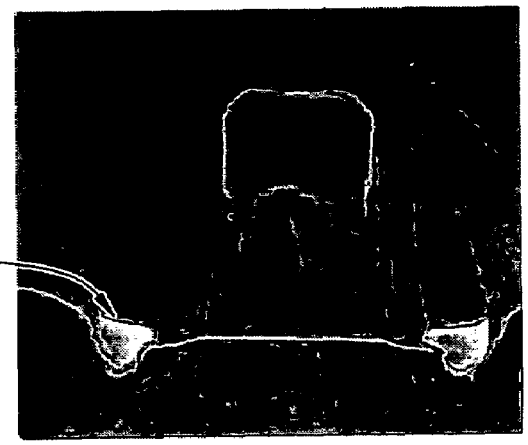
Figure 7:

FIG. 5 is a graph of damage profiles after performing a pre-amorphization implantation (PAI) process according to example embodiments. The graph illustrates damage profiles obtained using a Monte-Carlo simulation method, e.g., TRIM, when the ion implantation energy of the first impurity ions (e.g., $BF_2$) may be about 4 KeV and the ion implantation energies of the second impurity ions (e.g., Ge) may be about 5 KeV and about 10 KeV, respectively. The x-axis in FIG. 5 indicates a depth from the surface of the semiconductor substrate and the y-axis indicates the number of vacancies. The graph of FIG. 5 shows damage profiles (e.g., first and second damage profiles) of amorphized regions, according to the implantation of impurity ions. FIG. 6 is a photograph of a MOS transistor when the ion implantation energy of the germanium (Ge) second impurity ions used in the PAI process of FIG. 5 may be about 10 KeV according to example embodiments. FIG. 7 is a photograph of a MOS transistor when the ion implantation energy of the germanium (Ge) second impurity ions used in the PAI process of FIG. 5 may be about 5 KeV according to example embodiments. Referring to FIG. 6, when the ion implantation energy of the germanium (Ge) is about 10 KeV, a void defect A may be generated in the under-cut portion of the lower portion of the second gate spacer layer 38 due to the incomplete growth of the epitaxial region 18. Referring to FIG. 7, when the ion implantation energy of the germanium (Ge) may be about 5 KeV, an epitaxial region 18 having no void defect A of FIG. 6 may be formed.

Referring to FIGS. 5-7, as the first damage profile of the first impurity ions for amorphizing the semiconductor substrate 10 is close to the second damage profile of the second impurity ions for reducing, if not preventing, the channeling of the first impurity ions, the epitaxial growth may be performed. If the second damage profiles due to the second impurity ions may be substantially equal to the first damage profile due to the first impurity ions, epitaxial growth may be obtained. According to the Monte-Carlo simulation results, epitaxial growth may be obtained within an about 10% difference between the peak of the first damage profile and the peak of the second damage profile. If the second impurity ions may be easily diffused in the region where the first impurity ions may be implanted, the epitaxial growth may be performed without disturbance.

Figure 8:
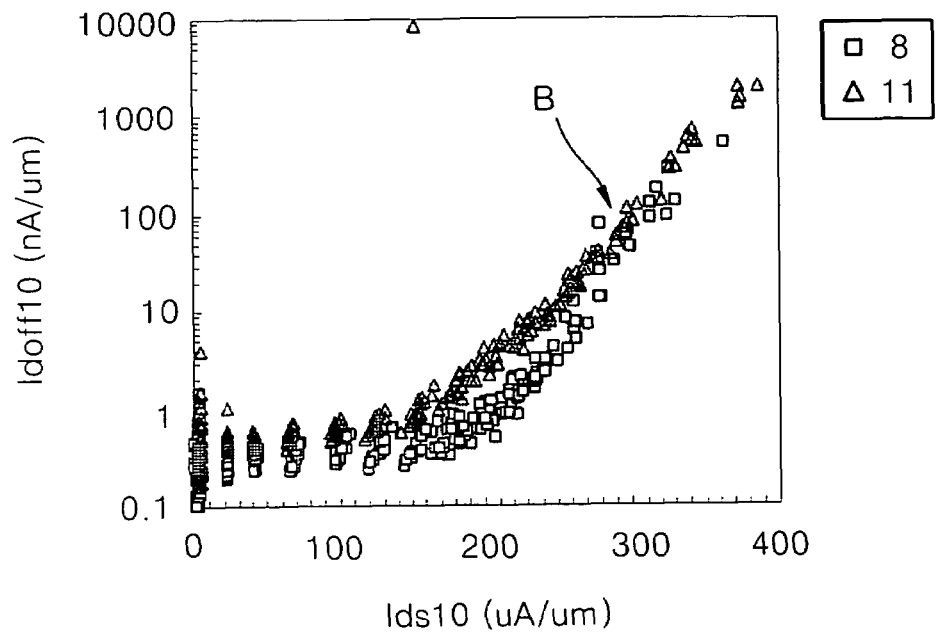
Figure 9:
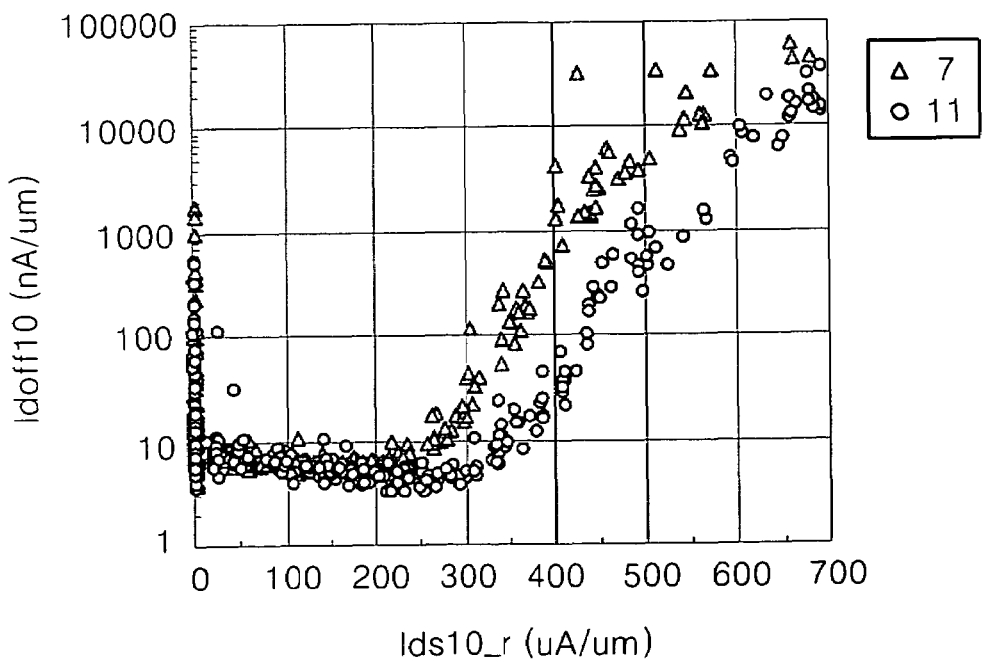

FIG. 8 is a graph illustrating relationships between a turn-on current and a turn-off current of the MOS transistor of FIG. 6 according to example embodiments. FIG. 9 is a graph illustrating relationships between a turn-on current and a turn-off current of the transistor of FIG. 7 according to example embodiments. In FIG. 8, the x-axis indicates a turn-on current and the y-axis indicates a turn-off current. The characters □ indicate measurement results for a reference MOS transistor and the characters □ indicate measurement results for the MOS transistor of FIG. 6. From the relationships between the turn-on current and the turn-off current, when the length of the channel region is relatively long and the turn-on current is relatively low (e.g., about 1 nA/μm to about 10 nA/μm), the operational reliability for the transistor of FIG. 6 may be better than that of the reference transistor because of the higher turn-on current. When the length of the channel region is relatively short and the turn-on current is about 100 nA/μm or more (region B), the turn-on current of the transistor of FIG. 6 may not be different from that of the reference transistor.

In FIG. 9, the x-axis indicates a turn-on current and the y-axis indicates a turn-off current. The characters □ indicate measurement results for a reference MOS transistor and the characters ○ indicate measurement results for the MOS transistor of FIG. 7. From the relationships between the turn-on current and the turn-off current, the turn-on current of the transistor of FIG. 7 may be higher than that of the reference transistor in both cases of relatively long and short channel regions. The operational reliability for the transistor of FIG. 7 may be higher and the current gain rate may be improved.

According to example embodiments, because the operation of partially etching the lower portion of the sidewalls of the gate pattern and the operation of forming an epitaxial region therein may be performed in-situ, an intermediate operation (e.g., an additional washing operation) may be omitted, thereby reducing the operation time. According to example embodiments, a portion may be amorphized before forming an epitaxial region therein and an epitaxial growth rate may be increased. According to example embodiments, the damage profile of impurity ions may be controlled in the amorphization process of the epitaxial forming region, resulting in the formation of an epitaxial region having no defect.

While example embodiments have been particularly shown and described with reference to example embodiments thereof, it will be understood by those of ordinary skill in the art that various changes in form and details may be made therein without departing from the spirit and scope of example embodiments as defined by the following claims.

What is claimed is:

1. A method of manufacturing a MOS transistor having an epitaxial region, the method comprising:

forming a gate pattern on a semiconductor substrate;

forming a first ion implantation region having a first damage profile by implanting first impurity ions into the semiconductor substrate using the gate pattern as an ion implantation mask;

forming a second ion implantation region having a second damage profile adjacent to the first damage profile by implanting second impurity ions into the semiconductor substrate using the gate pattern as an ion implantation mask; and partially etching a portion of the semiconductor substrate under the gate pattern and forming in-situ an epitaxial region on the etched semiconductor substrate.

2. The method of claim 1, wherein, in the forming of the second ion implantation region, a pre-amorphization implantation (PAI) process for amorphizing a portion of the semiconductor substrate is performed.

3. The method of claim 2, wherein the forming of the second ion implantation region is for reducing channeling of the second impurity ions.

4. The method of claim 2, wherein the amorphous portion of the semiconductor substrate at least partially remains in the lower portion of the sidewalls of the gate pattern.

5. The method of claim 1, wherein a difference between a peak of the first damage profile and a peak of the second damage profile is less than about 10%.

6. The method of claim 1, wherein the first impurity ions are Ge, and the second impurity ions are one of B, $BF_2$, As, and Sb.

7. The method of claim 6, wherein the first impurity ions are Ge, and the second impurity ions are $BF_2$.

8. The method of claim 7, wherein the ion implantation energy of the germanium (Ge) is in a range of about 3 KeV to about 5 KeV and the ion implantation energy of the $BF_2$ is in a range of about 3 KeV to about 4 KeV.

9. The method of claim 1, wherein a depth of the first ion implantation region is greater than that of the second ion implantation region.

10. The method of claim 1, wherein the partial etching of the lower portion of sidewalls of the gate pattern on the etched semiconductor substrate and the forming of the epitaxial region on the etched semiconductor substrate are performed in the same chemical vapor deposition (CVD) reaction chamber.

11. The method of claim 1, wherein, in the partial etching of the lower portion of sidewalls of the gate pattern on the semiconductor substrate, the semiconductor substrate is isotropically etched.

12. The method of claim 11, wherein a HCl gas is used as an etching gas in the partial etching of the lower portion of sidewalls of the gate pattern on the semiconductor substrate, and the partial etching is performed in a temperature range of about 650° C. to about 800° C.

13. The method of claim 12, wherein $GeH_4$, $SiH_4$, and $SiH_2Cl_2$ (Dichlorosilane, DCS) are mixed with the HCl gas for etching.

14. The method of claim 1, wherein the first damage profile is substantially equal to the second damage profile.

15. The method of claim 1, wherein the epitaxial region is formed of silicon germanium (SiGe).

16. The method of claim 1, wherein the forming of the epitaxial region is performed in a temperature range of about 650° C. to about 800° C. using a source gas comprising silicon germanium (SiGe).

17. The method of claim 1, wherein the epitaxial region is formed of silicon carbon (SiC).

18. The method of claim 1, further comprising:
forming a first gate spacer on the sidewalls of the gate pattern after the formation of the gate pattern and before the formation of the first ion implantation region.

19. The method of claim 18, further comprising:
forming a second gate spacer on the sidewalls of the gate pattern after the formation of the second ion implantation region.

20. The method of claim 1, further comprising:
forming a halo ion implantation region by implanting halo dopants into the semiconductor substrate using the gate pattern as an ion implantation mask before or after the formation of the first ion implantation region and the formation of the second ion implantation region.

21. The method of claim 1, further comprising:
forming the second ion implantation region for source/drain regions before the partial etching of the lower portion of sidewalls of the gate pattern on the semiconductor substrate.

22. The method of claim 1, wherein a lattice constant of the epitaxial region is different from that of the semiconductor substrate, and thus a compressive stress or a tensile stress is induced in the semiconductor substrate between the epitaxial region.

23. The method of claim 1, further comprising:
an annealing process at lower than about 900° C. before the formation of the epitaxial region.

* * * * *